(12) United States Patent
Cunnien

(10) Patent No.: US 7,425,081 B2
(45) Date of Patent: Sep. 16, 2008

(54) LED LAMP ASSEMBLY WITH CONDUCTIVE EPOXY LED INTERCONNECTIONS

(75) Inventor: Cole J. Cunnien, Canton, MI (US)

(73) Assignee: Magna International Inc., Concord, Ontario (CA)

( * ) Notice: Subject to any disclaimer, the term of this patent is extended or adjusted under 35 U.S.C. 154(b) by 229 days.

(21) Appl. No.: 10/543,747

(22) PCT Filed: Jan. 30, 2004

(86) PCT No.: PCT/CA2004/000125

§ 371 (c)(1),
(2), (4) Date: Jul. 29, 2005

(87) PCT Pub. No.: WO2004/070768

PCT Pub. Date: Aug. 19, 2004

(65) Prior Publication Data

US 2006/0114673 A1  Jun. 1, 2006

(51) Int. Cl.
*F21S 13/14* (2006.01)
*H05K 1/09* (2006.01)

(52) U.S. Cl. ............ 362/252; 362/362; 362/800; 174/257; 174/261; 439/86; 439/110

(58) Field of Classification Search ............ 362/249, 362/252, 251, 362, 545; 174/257, 256, 261; 439/86, 110

See application file for complete search history.

(56) References Cited

U.S. PATENT DOCUMENTS

| 5,455,749 | A | 10/1995 | Ferber |
| 5,567,037 | A | 10/1996 | Ferber |
| 5,857,767 | A | 1/1999 | Hochstein |
| 5,960,942 | A * | 10/1999 | Thornton ............ 362/85 |
| 6,411,022 | B1 * | 6/2002 | Machida ............ 362/249 |
| 6,520,669 | B1 * | 2/2003 | Chen et al. ............ 362/545 |
| 6,660,935 | B2 * | 12/2003 | Southard et al. ............ 362/249 |
| 6,866,394 | B1 * | 3/2005 | Hutchins et al. ............ 362/249 |
| 7,128,438 | B2 * | 10/2006 | Ratcliffe ............ 362/243 |
| 7,135,034 | B2 * | 11/2006 | Friedman et al. ............ 362/555 |
| 7,207,693 | B2 * | 4/2007 | Ratcliffe ............ 362/243 |
| 2001/0055458 | A1 * | 12/2001 | Ladd ............ 385/129 |
| 2003/0103356 | A1 * | 6/2003 | Hutchins et al. ............ 439/110 |
| 2004/0016568 | A1 * | 1/2004 | Palanisamy ............ 174/261 |

FOREIGN PATENT DOCUMENTS

| EP | 0 250 006 | 2/1987 |
| FR | 2 481 567 | 4/1981 |
| GB | 1 457 805 | 3/1974 |

* cited by examiner

*Primary Examiner*—Ismael Negron
(74) *Attorney, Agent, or Firm*—Clark Hill PLC

(57) ABSTRACT

A lamp assembly including at least two light emitting diodes (LEDs) attached to an electrically non-conductive housing by at least two beads of electrically conductive epoxy. The electrically conductive epoxy beads are disposed in at least two grooves formed in the housing, for providing at least two voltage rails for connecting the LEDs to a driving circuitry.

12 Claims, 5 Drawing Sheets

LED LAMP ASSEMBLY WITH CONDUCTIVE EPOXY LED INTERCONNECTIONS

FIELD OF INVENTION

The invention relates to the field of lamps, and in particular a LED lamp assembly with an integrated circuit.

BACKGROUND OF INVENTION

Light emitting diodes (LEDs) are gradually replacing incandescent light bulbs in many automotive applications. For example, it is attractive to use LEDs for automotive exterior lighting applications such as brake, turn or other signal lamps due to the long life and high luminance provided the latest generation of LEDs. LEDs also enable the lamp housing to have a narrower or shallower profile, which can be advantageous in many applications.

In order to provide luminance levels comparable to incandescent lamps, a series or plurality of LEDs must often be used in a lamp thus increasing the complexity and cost of manufacture. For example, the conventional manufacturing practice is to mount the LEDs on a printed circuit board (PCB), which in turn is mounted in a lamp housing. The problem with this practice is that it typically requires the use of sophisticated soldering machinery or techniques, and the resultant PCBs are typically limited in form factor since PCBs are generally flat (complexly shaped PCBs being considerably more expensive to procure). However, the luminaire housing, such as an automotive turn signal, may be a complex shape and thus a PCB-based LED lamp may not be the most optimal design choice.

Examples of LED arrays mounted on PCBs or other substrates can be found in U.S. Pat. Nos. 4,742,432; 4,966,862; 5,119,174; 5,331,512; 6,299,337;and 6,346,777.

An alternative method of constructing LED arrays employs a foldable metal substrate onto which the LEDs can be solderlessly connected using a clinching machine. The metal substrate features flexible joints between rows of LED bus bars that allow the substrate to be formed to a complex shape. Such systems are disclosed in U.S. Pat. No. 5,404,282 and U.S. Pat. No. 5,519,596. A commercially available system similar to that disclosed in U.S. Pat. No. 5,519,596 is marketed in association with the SnapLED™ brand by Lumileds Lighting of San Jose, CA. This system requires machinery for the creation of a metallic substrate and tooling for clinching the LEDs to the metallic substrate (or the outsourcing thereof), as well as tooling for stamping the metallic substrate into the desired final form.

A more economical approach is desired to minimize the cost and/or complexity for assembling LED arrays, especially for use in complexly shaped luminaire housings such as may be found in automotive exterior lighting applications.

SUMMARY OF INVENTION

According to one aspect of the invention, a lamp is provided which includes an electrically non-conductive housing. One or more light emitting diodes (LEDs) are attached to the housing by one or more beads of electrically conductive epoxy. The LEDs can also optionally be mechanically attached to the housing. The electrically conductive epoxy provides one or more voltage rails for connecting the LEDs to a driving circuitry.

In the preferred embodiment, at least two grooves are formed in the housing. A platform formed or present between two walls provides a snap for mechanically attaching the LEDs to the housing. One of the grooves is intended for placement of LED cathodes therein and the other groove is intended for placement of LED anodes therein. A bead of the electrically conductive epoxy is deposited in each of the grooves so as to provide a voltage rail to power the LEDs.

According to another aspect of the invention, a method of constructing a lamp assembly is provided. An electrically non-conductive housing is provided. One or more light emitting diodes (LEDs) are mechanically attached to One or more beads of electrically conductive epoxy are deposited on the housing so as to fasten the LEDs to the housing and connect the LEDs to a driving circuit.

BRIEF DESCRIPTION OF DRAWINGS

The foregoing and other aspects of the invention will become more apparent from the following description of illustrative embodiments thereof and the accompanying drawings, which illustrate, by way of example only, the principles of the invention. In the drawings.

DETAILED DESCRIPTION OF PREFERRED EMBODIMENTS

Figure 1:
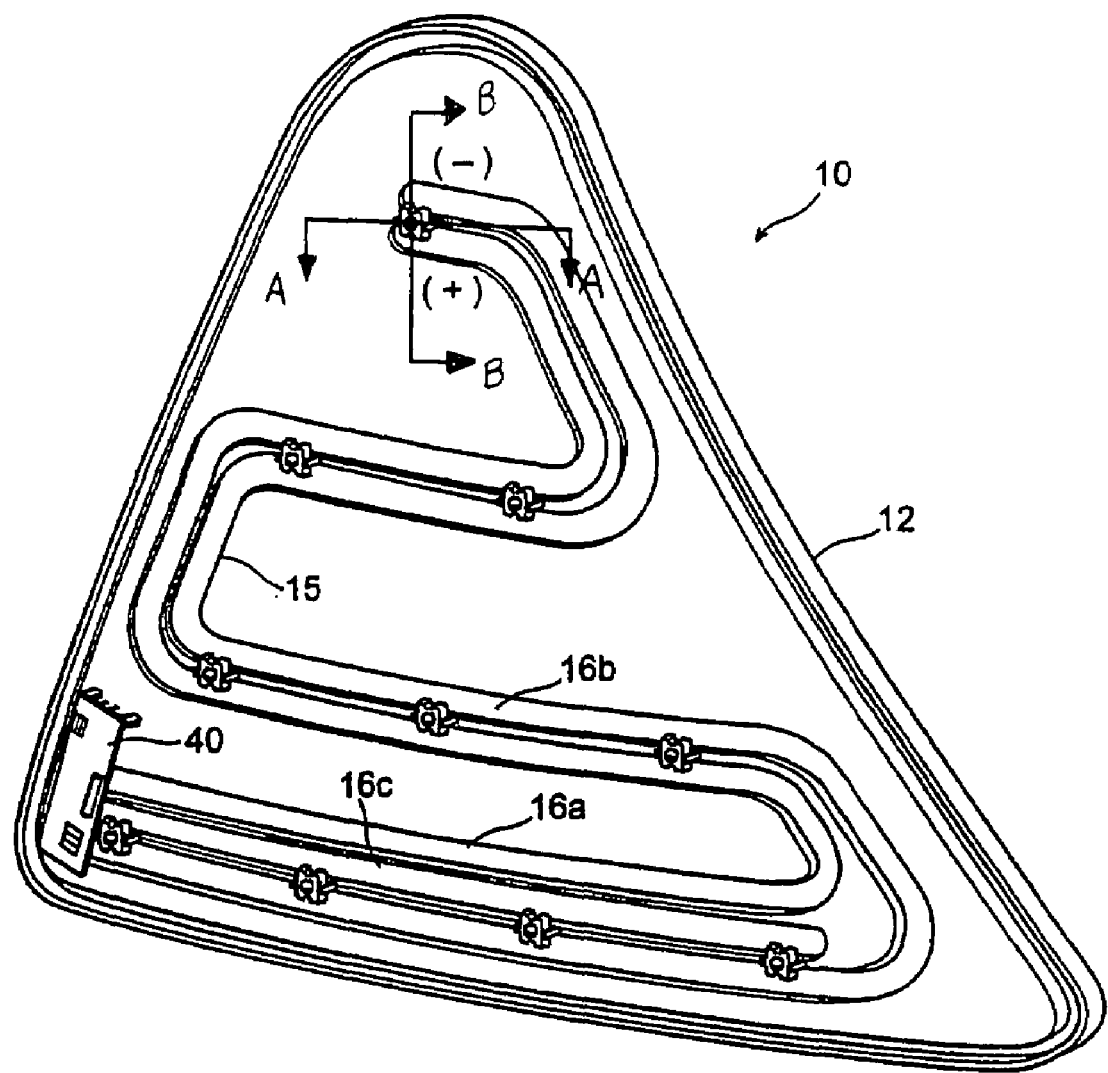
FIG. 1 is a perspective view of a lamp according to the preferred embodiment.

FIG. 1 shows an LED-based lamp 10 comprising a lamp housing assembly 12 onto which a lens (not shown) may be mounted along the perimeter of the housing. The housing 12 is preferably constructed from a non-electrically conductive plastic material such as polyvinyl chloride (PVC), polyethylene terephthalate (PET) or acrylonitrile butadiene styrene (ABS) and may be manufactured via well known molding techniques, as known in the art per se. In the illustrated example, the housing 12 is curvilinear in shape (as seen best in FIG. 2) but it should be understood that the housing 12 may be molded to much more complex shapes, determined by styling criteria. Other types of non-conductive materials may be employed for the housing, but as will be discussed shortly, a material which is somewhat resilient is most preferred.

Figure 2:
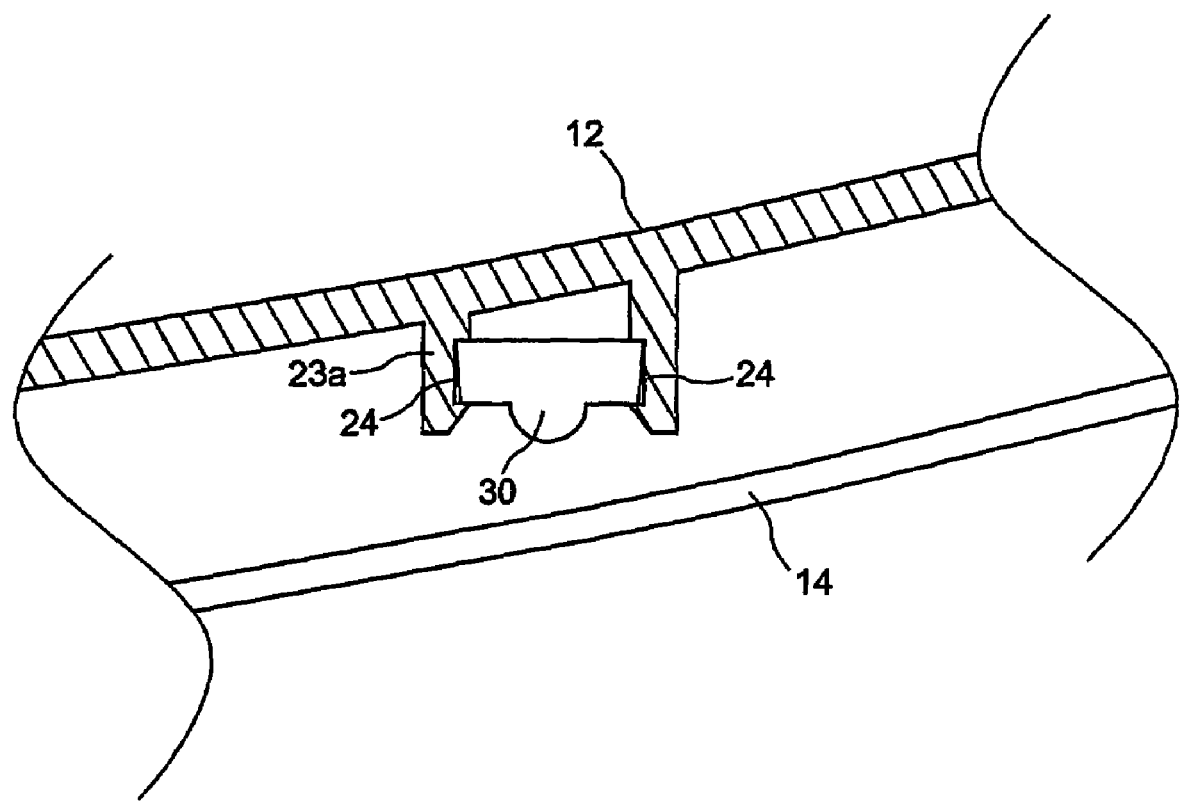
FIG. 2 is a sectional view of the lamp taken along line A-A in FIG. 1.
Figure 3:
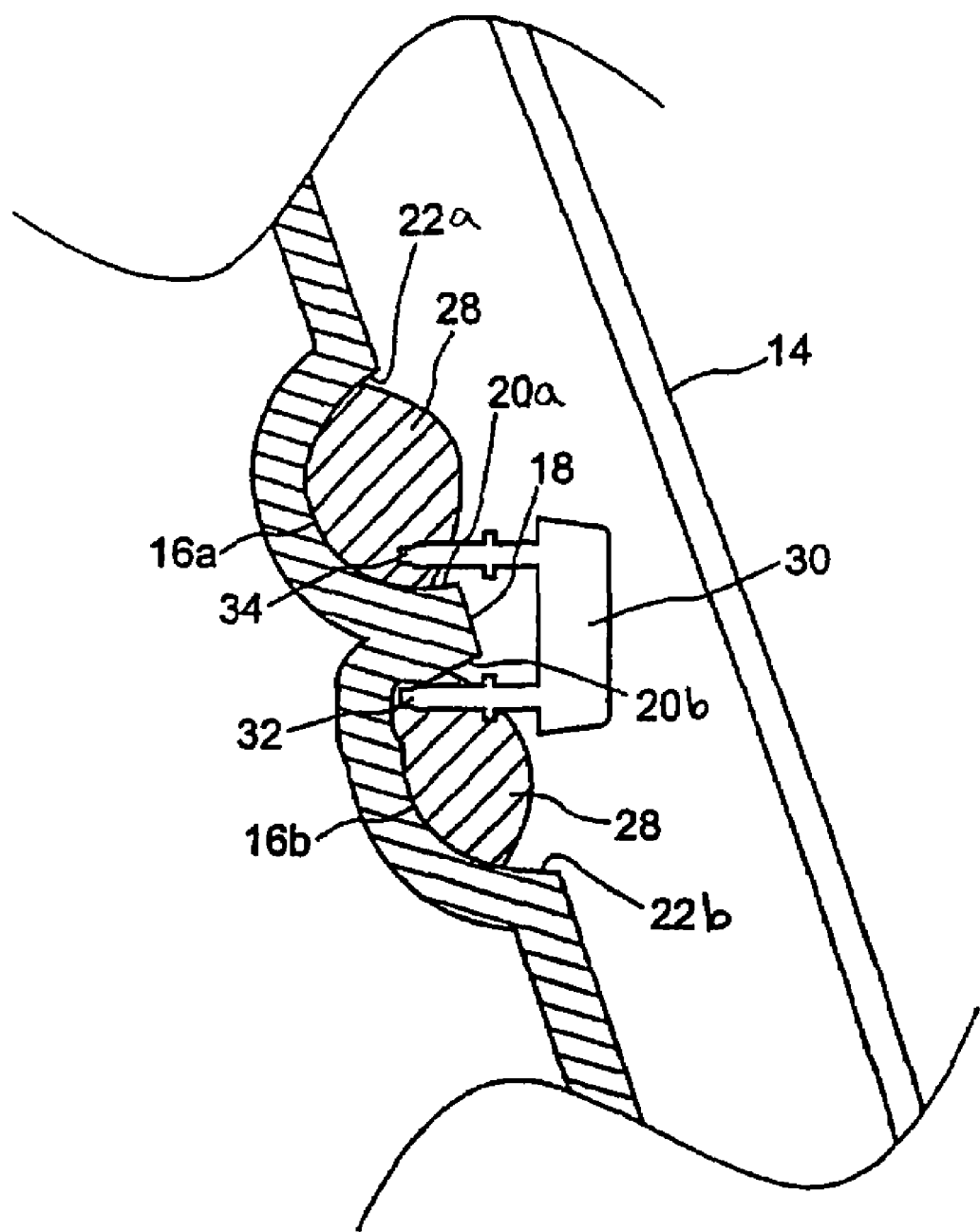
FIG. 3 is a sectional view of the lamp taken along line B-B in FIG. 1.
Figure 4:
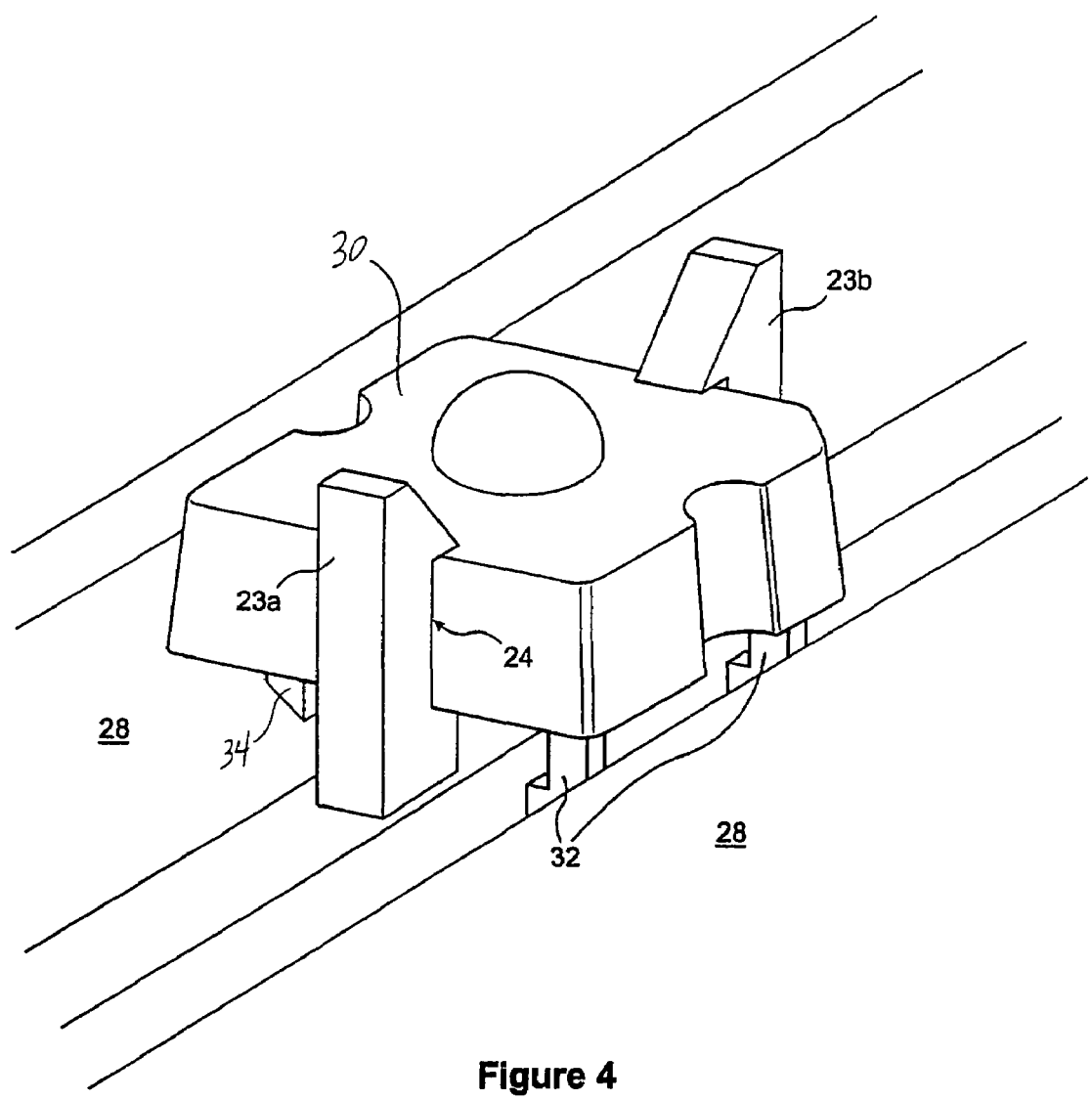
FIG. 4 is a detailed perspective view of a portion of the lamp in FIG. 1.

The housing 12 includes at least one channel 15 formed therein which features two independent grooves 16a and 16b. Cross-sectional profiles of the preferred housing 12 along lines A-A and B-B in FIG. 1 are shown in FIGS. 2 and 3, and a detailed perspective view of the housing 12 is shown in FIG. 4. As seen in these drawings, the channel 15 includes inner walls 20a and 20b and outer walls 22a and 22b. A ridge or platform 18 is formed between the inner walls 20a, 20b in the junction. On this platform, a plurality of snaps are provided, each comprising two posts 23a, 23b. Each post 23a, 23b includes a small notch 24 therein and the top portion of the post 23a, 23b above the notches 24 is slightly tapered or chamfered.

An LED 30, such as a SuperFlux™ model manufactured by Lumileds of San Jose, CA. (which is shown in isolation in FIG. 3) is mechanically mounted onto the posts 23a, 23b, in or over the channel 15. The posts 23a, 23b and notches 24 are dimensioned such that cathode lead(s) or pins (s) 32 of the LED 30 extend into one of the grooves 16a, 16b (as illustrated, groove 16a) and anode lead(s) or pin(s) 34 extend into the other groove (as illustrated, groove 16b). The body of the LED 30 is supported by the posts 23a, 23b, the spacing of which is closely matched to the dimensions of the LED body so as to provide a snap fit. The LED 30 is preferably forcibly inserted so as to deflect the posts 23a, 23b until the LED body nestles into the notches 24 formed therein. The posts 23a, 23b are preferably formed from a resilient organic material such as PVC, PET or ABS plastic so that once the LED 30 is inserted it cannot back out of the posts 23a, 23b unless they are deflected apart. The lamp 10 is unlikely to encounter such forces under normal operating conditions and thus the preferred embodiment provides a snap mechanism for mechanically attaching the LEDs 30 to the housing 12.

In addition to the snap, a bead of electrically conductive epoxy 28 is used to bond the cathode 32 and anode 34 leads of the LED 30 to the channel 15 and hence the housing 12. The epoxy 28 is also thermally conductive, and thus serves to both electrically connect together all of the cathode 32 or anode 34 leads of the LEDs 30 mounted in the same groove 16a or 16b, and provides a heat sink for carrying heat away from the LED 30. By mounting the LED 30 on the posts 23a, 23b, the grooves 16a, 16b can be made relatively wide and deep to provide sufficient heat dissipation and electrical conduction for many applications. Examples of suitable epoxies include TIGA 920H™, TIGA 951™, and TIGA 901 silver conductive epoxies marketed by Resin Technology Group LLC, of S. Easton, Mass.; Bolger C-14F™ epoxy marketed by Tech Film Services Inc. of Billerica, Mass.; and Metaduct™ epoxies marketed by Mereco Technologies Group of West Warwick, R.I. These epoxies are flexible, deformable, functional over a wide range of operating temperatures, and can be laid over a complex topography via manual or automated means.

In the preferred embodiment, the beads of electrically conductive epoxy 28 are laid by a robot as is well known in the art. The above mentioned epoxies have some viscosity prior to curing, and thus the epoxy 28 can fill the groove 16a or 16b to ensconce the cathode 32 or anode 34 leads. Furthermore, the manipulator or working tip of the robot can be angled to reach underneath the LED body near the cathode 32 or anode 34 leads in order to deposit the epoxy 28 proximate thereto.

In the illustrated embodiment, when filled with the electrically conductive epoxy 28, groove 16b functions as a ground rail that electrically connects the cathode leads 32 of the series of LEDs 30 mounted therein. Groove 16a, when filled with the electrically conductive epoxy 28, functions as a positive voltage rail for connecting the anode leads 34 of the series of LEDs 30 mounted therein. The illustrated lamp 10 includes a third groove 16c which cooperates with groove 16b for mounting the anode leads 34 of another series of LEDs 30 associated with a second electrical circuit. In this region of the housing 12, grooves 16b and 16c. Numerous other patterns can be employed for mounting one or more series of LEDs, the number of LEDs in each channel being limited only by the electrical and thermal conduction limits of the particular epoxy being used.

A PCB 40 carrying LED control and driving circuitry is mounted to the housing 12 as well known in the art. The PCB 40 includes terminations (not explicitly shown) for electrically connecting the beads of electrically conductive epoxy 28 to the driving circuitry.

In an alternative manufacturing process, it is possible to first lay down the beads of electrically conductive epoxy 28 using a glue robot and the use of a second robot to mount the LEDs 30 in the channel 15. This is possible due to the time typically required for the epoxy 28 to cure, which often exceeds 10 minutes. This will ensure a continuous bead of the electrically conductive epoxy 28 in each groove 16a, 16b, 16c underneath each LED 30. It may also be possible to avoid the use of the mechanical attachments, if the epoxy 28 is sufficiently cured to retain the LED 30 in position when inserted therein.

In a still further manufacturing process, it may be desirable to lay down a first layer of electrically conductive epoxy in each groove, followed by a flexible metallic strip in each groove, followed by a second layer of electrically conductive epoxy in each groove. The LEDs may be mounted in the channel before or after the deposit of the second epoxy layer.

By mounting the LEDs 30 directly onto the flexible housing using a ductile epoxy, the lamp housing 12 remains somewhat flexible which is advantageous when installing the lamp housing 12 onto the vehicle.

Figure 5:
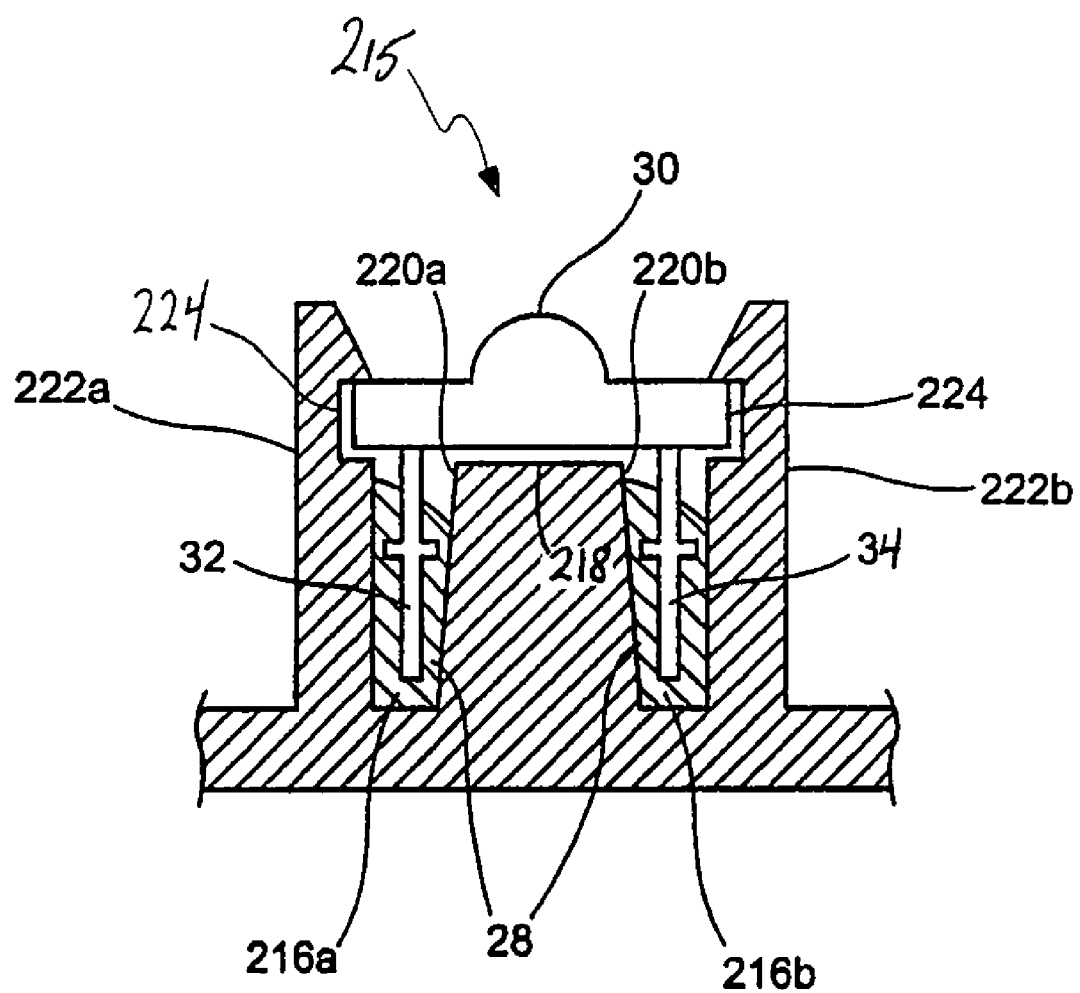
FIG. 5 is a sectional view of a lamp according to an alternative embodiment of the invention.

An alternative embodiment of the invention is shown in cross sectional view in FIG. 5. In this embodiment, a channel 215 formed in the housing 12 includes planar inner walls 220a and 220b and planar outer walls 222a and 222b, the outer walls 222a, 222b being taller than the inner walls 220a, 220b. Independent grooves 216a and 216b are located between the inner 220a, 220b and outer 222a, 222b walls, as shown. A ridge or platform 218 is formed between the inner walls 220a, 220b, which are slightly tapered or chamfered. The outer walls 222a, 222b include small notches 224 therein and the top portions of the outer walls 222a, 222b above the notches 224 are also slightly tapered or chamfered. In this embodiment, the spacing between the outer walls 222a, 222b of the channel 215 and the size of each notch 224 is closely matched to the dimensions of the LED body so as to provide a snap fit. If desired, the body of the LED 30 can also be supported by the platform 218.

The illustrated embodiments have shown the use of a snap for mechanically attaching the LEDs to the housing, but a variety of other mechanisms such as detents, index keys, latches or other such mechanisms can be used to mechanically attach the LEDs to the housing. The mechanical attachment means preferably locks the LED to the housing but in alternative embodiments it does not need to immovably lock the LEDs to the housing since the epoxy provides an additional means for immovably locking the LEDs in place.

Those skilled in the art will appreciate that a variety of modifications may be made to the preferred embodiments without departing from the spirit of the invention.

The invention claimed is:

1. A lamp assembly comprising:
   an electrically non-conductive housing, said housing including at least two grooves formed therein;
   at least two LEDs, each of said LEDs including an anode lead and a cathode lead, wherein a first of said grooves receives said anode lead of said LEDs and a second of said grooves receives said cathode lead of said LEDs; and
   at least two beads of electrically conductive epoxy disposed along said first and second grooves fastening said LEDs to said housing and electrically connecting said LEDs for illumination.

2. A lamp assembly as set forth in claim 1, wherein a first of said beads is inserted into said first groove and a second of said beads is inserted into said second groove.

3. A lamp assembly as set forth in claim 2, wherein said at least two grooves are separated by a platform presenting a mounting surface receiving said LEDs.

4. A lamp assembly as set forth in claim 3, wherein said platform has at least one pair of corresponding tangs that snappingly receives one of said LEDs mechanically attaching said LED to said housing.

5. A lamp assembly as set forth in claim 4, wherein said assembly further comprises a PCB having an LED control and driving circuit, said PCB being electrically connected to said beads enabling illumination of said LEDs.

6. A lamp assembly as set forth in claim 1, wherein said housing has at least two fasteners attaching said LEDs thereto.

7. A lamp assembly as set forth in claim 6, wherein each of said fasteners comprises at least one pair of cooperating tangs that snappingly receives one of said LEDs.

8. A lamp assembly as set forth in claim 7, wherein said housing has a platform presenting an elongated mounting surface receiving said LEDs.

9. A lamp assembly as set forth in claim 8, wherein said platform separates said at least two beads.

10. A lamp assembly as set forth in claim 9, wherein said fasteners extend from said platform.

11. A lamp assembly as set forth in claim 9, wherein said first and second grooves are disposed on opposite sides of said platform and a first of said beads is inserted into said second groove and a second said beads is inserted into said second groove.

12. A lamp assembly as set forth in claim 11, wherein said grooves extend between at least one pair of tangs.

* * * * *